US012777574B2

(12) United States Patent
Zhao et al.

(10) Patent No.: US 12,777,574 B2
(45) Date of Patent: Oct. 27, 2026

(54) COAXIAL GROUND SHIELD FOR IMPROVED SIGNAL INTEGRITY

(71) Applicant: NVIDIA Corporation, Santa Clara, CA (US)

(72) Inventors: Tibet Zhao, LongHua Town (CN); Baal Yang, Shenzhen (CN); Yongwei Chen, Shenzhen (CN); Jiawei Zeng, Shenzhen City (CN)

(73) Assignee: NVIDIA Corporation, Santa Clara, CA (US)

(*) Notice: Subject to any disclaimer, the term of this patent is extended or adjusted under 35 U.S.C. 154(b) by 163 days.

(21) Appl. No.: 18/588,477

(22) Filed: Feb. 27, 2024

(65) Prior Publication Data

US 2025/0275054 A1 Aug. 28, 2025

(51) Int. Cl.

| | |
|---|---|
| ***H05K 1/02*** | (2006.01) |
| ***H05K 1/11*** | (2006.01) |
| ***H05K 3/00*** | (2006.01) |
| ***H05K 3/42*** | (2006.01) |

(52) U.S. Cl.

CPC ........... *H05K 1/0222* (2013.01); *H05K 1/113* (2013.01); *H05K 3/0047* (2013.01); *H05K 3/0094* (2013.01); *H05K 3/429* (2013.01); *H05K 2201/0212* (2013.01)

(58) Field of Classification Search

CPC .. H05K 1/0222; H05K 3/0047; H05K 3/0094; H05K 3/429

See application file for complete search history.

(56) References Cited

U.S. PATENT DOCUMENTS

| | | | | | |
|---|---|---|---|---|---|
| 8,354,601 | B2 * | 1/2013 | Russell | H05K 1/0222 | 174/262 |
| 10,470,311 | B2 | 11/2019 | Twarog et al. | | |
| 2005/0146390 | A1 | 7/2005 | Baek | | |
| 2005/0247482 | A1 | 11/2005 | Nakamura | | |
| 2009/0133913 | A1 * | 5/2009 | Kushta | H01L 23/49827 | 174/250 |
| 2012/0119853 | A1 * | 5/2012 | Kushta | H05K 1/0251 | 333/204 |
| 2012/0187550 | A1 | 7/2012 | Wu | | |
| 2018/0184522 | A1 | 6/2018 | Rodriguez et al. | | |
| 2019/0159333 | A1 * | 5/2019 | Sinha | H05K 1/115 | |
| 2021/0190825 | A1 * | 6/2021 | Brecht | G01R 31/31905 | |
| 2022/0015225 | A1 | 1/2022 | Sinha et al. | | |
| 2022/0369452 | A1 | 11/2022 | Pritchard et al. | | |
| 2022/0418094 | A1 | 12/2022 | Nitta et al. | | |
| 2023/0019563 | A1 | 1/2023 | Nitta et al. | | |

* cited by examiner

*Primary Examiner* — Sherman Ng

(74) *Attorney, Agent, or Firm* — Lowenstein Sandler LLP

(57) ABSTRACT

A device includes a printed circuit board (PCB) including a signal trace electrically coupled to a signal via. The device further includes a coaxial ground shield configured to reduce signal interference with respect to the signal via. The coaxial ground shield includes a ground via formed in the PCB substantially surrounding the signal via and substantially coaxial with the signal via. The coaxial ground shield further includes metal plating on a wall of the ground via. The metal plating is electrically coupled to a ground plane of the PCB. The coaxial ground shield further includes resin at least partially filling the ground via.

22 Claims, 14 Drawing Sheets

300F

300H

COAXIAL GROUND SHIELD FOR IMPROVED SIGNAL INTEGRITY

TECHNICAL FIELD

At least one embodiment pertains to printed circuit board (PCB) fabrication. For example, at least one embodiment pertains to technology for implementing coaxial ground shields for improved signal integrity.

BACKGROUND

A printed circuit board (PCB) can be used to connect electronic components. A PCB can include multiple conductive layers. The conductive layers can include at least a top layer and a bottom layer. The conductive layers can further include one or more layers disposed between the top layer and the bottom layer. In such PCBs, the top layer and the bottom layer can be referred to as "exterior layers" and each additional layer can be referred to as an "interior layer." A PCB can include one or more vias that enable respective interconnections between conductive traces on the different layers. More particularly, a via can be formed by forming a hole that traverses through at least two adjacent conductive layers, and plating the hole with a conductive material that forms an electrical connection so that the conductive traces on different layers are electrically connected.

Crosstalk is a phenomenon where electrical signals on one trace and/or via unintentionally interfere with or affect the signals on nearby traces and/or vias. This interference can lead to signal degradation, data errors, or other performance issues in the associated electronic circuits. Crosstalk occurs due to electromagnetic coupling between traces and/or vias in close proximity, and it can be particularly problematic at high data transmission frequencies or in densely populated PCBs.

BRIEF DESCRIPTION OF DRAWINGS

Various embodiments in accordance with the present disclosure will be described with reference to the drawings, in which.

DETAILED DESCRIPTION

Figure 1A:
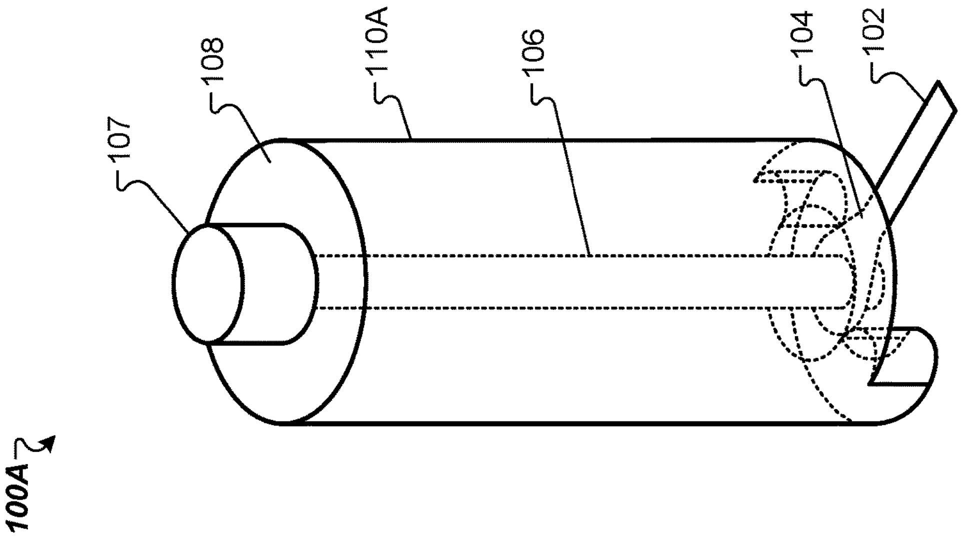
FIGS. 1A-1B are perspective views of an example coaxial ground shield, in accordance with at least some embodiments.

As described above, A PCB can further include at least one via. A via is a plated hole that passes through multiple layers of a PCB to make electrical connections between different layers of the PCB.

One example of a via is a through-hole via. A through-hole via extends through all layers of a PCB, connecting the top and bottom layers, as well as any interior layers. Accordingly, through-hole vias are visible from both sides of the PCB. Another example of a via is a blind via. A blind via refers to a via that connects an exterior layer of a PCB (e.g., the top layer or the bottom layer) to one or more interiors layer of the PCB. Accordingly, blind vias are only visible from one side of the PCB. A further example of a via is a buried via. A buried via refers to a via formed between two interior layers of a PCB. Accordingly, a buried via is not visible from either side of the PCB.

As described above, during transmission of signals across conductive signal traces and/or vias on a PCB, crosstalk can occur. Crosstalk refers to undesired electromagnetic interference or coupling between signal traces and/or vias on the PCB. This interference can occur when signals on one trace and/or via affect or "talk" to nearby traces and/or vias, causing unintended signal distortion or noise. Crosstalk can be particularly problematic in high-speed digital circuits and analog circuits where signal integrity is critical. Crosstalk can cause various issues, including distorting signal shapes, affecting the timing of signals, and/or introducing bit errors or data corruption.

To improve signal integrity, and mitigate crosstalk on a PCB, the PCB can include ground planes that act as shields helping to block or reduce the electromagnetic fields that cause crosstalk. Some common solutions that help mitigate crosstalk with respect to signal vias include forming multiple ground vias around each of the signal vias. The multiple ground vias are electrically coupled to the ground plane and extend between multiple layers of the PCB to form a shield around at least part of the signal via. However, this arrangement of ground vias does not provide sufficient shielding for especially high transmission rates, such as for high-speed differential pair or single-end signals. For example, ground vias may not provide sufficient ground shielding of a signal via transmitting 212 Gbps per differential pair or 45 Gbps per lane single-end signals. Additionally, ground vias often extend through all layers of a PCB, limiting a power plane of the PCB and limiting the locations at which signal traces can fan out from the signal via.

Aspects of the present disclosure can address the deficiencies described above and other challenges by implementing coaxial ground shields on PCBs for improved signal integrity. A PCB as described herein can include a stack of layers. The stack of layers can include a first signal trace on a first layer and a second signal trace on a second layer. The signal traces can be electrically coupled by a signal via extending between the two layers. To reduce signal interference with respect to the signal via, the PCB can include a coaxial ground shield that provides ground shielding for the signal via. The coaxial ground shield can be made up of a ground via formed in the PCB substantially surrounding the signal via. In some embodiments, the ground via is substantially coaxial with the signal via. The coaxial ground shield further includes metal plating on the walls of the ground via. The metal plating may be electrically coupled to a ground plane of the PCB. In some embodiments, the coaxial ground shield includes a resin (e.g., and/or ink) at least partially filling the ground via so that the coaxial ground shield does not form a void in the PCB.

In some embodiments, the coaxial ground shield substantially surrounds a single signal via, such as for the transmission of single-lane signals. However, in some embodiments, the coaxial ground shield substantially surrounds two signal vias, such as for the transmission of a differential pair signal. Two signals can be accommodated within the coaxial ground shield by forming two overlapping ground vias side-by-side. The two overlapping side-by-side ground vias may each be substantially coaxial with respect to the corresponding signal via.

A coaxial ground shield may be formed in a PCB using methods described herein. In some embodiments, multiple layers (e.g., conductive and/or non-conductive layers) are laminated together to form a multi-layer structure (e.g., a multi-layer PCB). To form a coaxial ground shield, a hole is drilled through at least some of the laminated layers to form a ground via. The ground via hole may be drilled with a mechanical drilling tool. Multiple smaller holes may be drilled adjacent to one another in the bottom of the ground via to form a slot in the bottom of the ground via. The slot may have a C-shaped profile that at least partially surrounds a conductive pad. The multiple smaller holes may be drilled adjacent to one another using a laser drilling tool. Once the ground via and the slot are formed, the interior walls may be plated with conductive material (e.g., metal plating). The ground via (including the slot) may be filled with a resin (e.g., an ink resin, etc.) to eliminate voids in the ground via. To form a signal via, a hole may be drilled through the coaxial ground shield and one or more layers of the PCB. In some embodiments, the hole is drilled completely through the coaxial ground shield and the remaining layers of the PCB, such as to form a through-hole via. In some embodiments, the hole is drilled through the coaxial ground shield and only through one or more of the layers, such as to form a blind via. After drilling, the interior walls of the hole are plated with conductive material. In some embodiments (e.g., such as when the signal via is a through-hole via), the bottom portion of the signal via is back-drilled to remove the conductive material from the bottom portion of the signal via. The signal via may be filled with a resin to eliminate voids in the signal via. The signal via may be formed substantially coaxial with the ground via. The signal via may be for transmitting an electrical signal between signal traces that are located on different layers of the PCB.

Advantages of the present disclosure include, for example, improved signal integrity by reducing crosstalk between signal traces and/or signal vias within close proximity. A coaxial ground shield provides improved ground shielding of a signal via for high rates of data transfer (e.g., such as for 212 Gbps per differential pair or 45 Gbps per lane single-end signals) when compared to current solutions. Moreover, the coaxial ground shield described herein can be made with a reduced cost compared to conventional solutions.

Figure 1B:
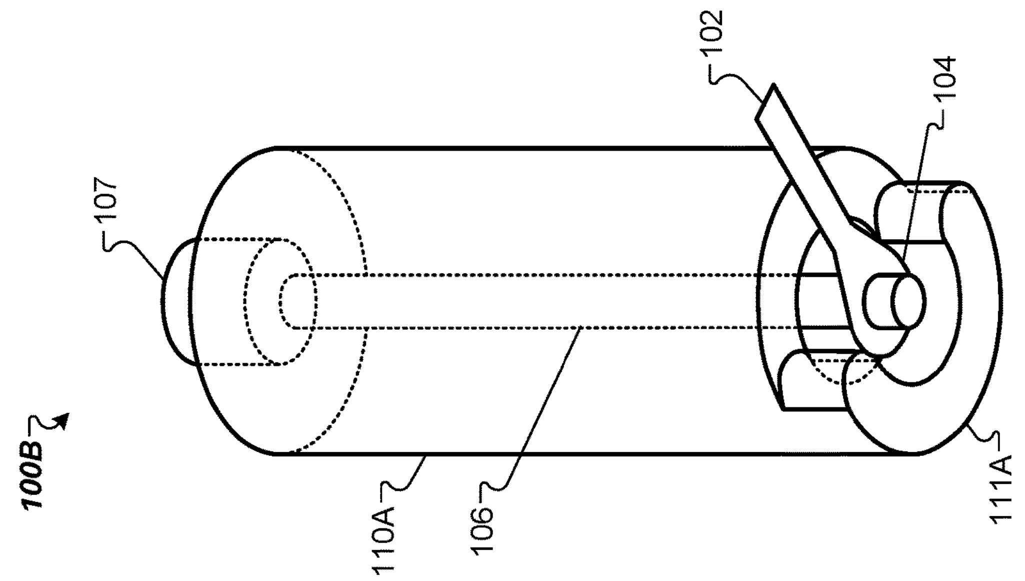

FIGS. 1A-1B are perspective views of an example coaxial ground shield 110A, in accordance with at least some embodiments. Referring to FIG. 1A, a top perspective view 100A of an example coaxial ground shield 110A is shown. Referring to FIG. 1B, a bottom perspective view 100B of an example coaxial ground shield 110A is shown. The arrangements shown in FIGS. 1A-1B may be used for the transmission of a single-end signal. In some embodiments, coaxial ground shield 110A substantially surrounds a signal via 106. The coaxial ground shield 110A may form a substantially cylindrical profile that surrounds the signal via 106, protecting the signal via 106 from crosstalk. The coaxial ground shield 110A and the signal via 106 may be substantially coaxial. The signal trace 102 may electrically connect to the signal via 106 by a signal pad 104. The signal via 106 may electrically couple the signal pad 104 (e.g., and the signal trace 102) with a terminal 107 for the transmission of electrical signals from the signal trace 102 to the terminal 107 and/or vice versa. In some embodiments, the coaxial ground shield 110A includes a slot 111A extending from the bottom of the coaxial ground via 110A. The slot 111A may at least partially surround the signal pad 104, protecting the signal pad 104 from crosstalk. The signal trace 102 can connect to the signal via 106 through the open portion of the slot 111A. In some embodiments, the slot 111A has a C-shaped profile. In some embodiments, the walls of the slot 111A are between approximately 0.10 mm and 0.15 mm from the edges of signal pad 104. In some embodiments, the walls of the slot 111A are between approximately 0.10 mm and 0.15 mm from the edges of the signal trace 102.

In some embodiments, the inner walls of the coaxial ground shield 110A (including the inner walls of the slot 111A) are plated with a metal plating (e.g., a conductive material, etc.). The inner walls of the signal via 106 may be plated with the same metal plating. The metal plating can include a metal such as copper, tin, lead, gold, nickel, silver, or one or more metal alloys, etc. In some embodiments, the metal plating of coaxial ground shield 110A is electrically coupled to a ground plane of a PCB. By electrically coupling the metal plating of coaxial ground shield 110A with a ground plane, the coaxial ground shield 110A can reduce signal interference with respect to the signal via 106. For example, the coaxial ground shield 110A may protect the signal via 106 from crosstalk emitted from other signal vias in close proximity on the PCB.

In some embodiments, the coaxial ground shield 110A and/or the signal via 106 are at least partially filled with resin 108. The coaxial ground shield 110A and/or the signal via 106 may be filled with resin 108 to minimize and/or eliminate voids in the PCB. The resin 108 may include an epoxy resin or a polyimide resin.

Figure 2B:
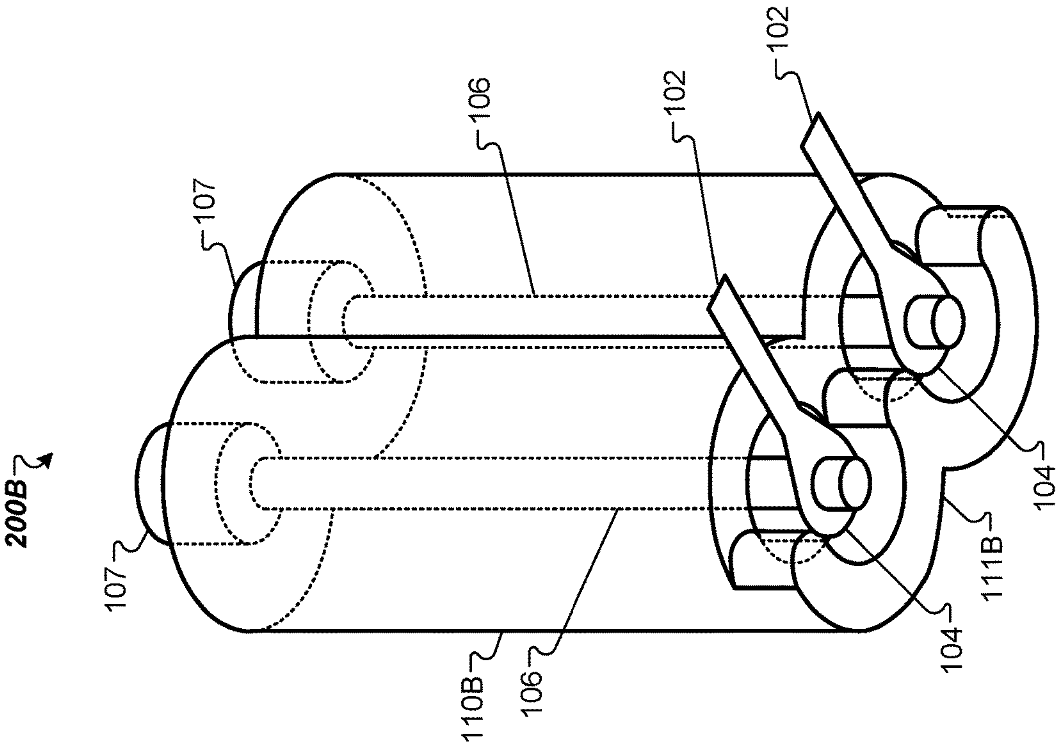
FIGS. 2A-2B are perspective views of an example dual coaxial ground shield, in accordance with at least some embodiments.
Figure 2A:
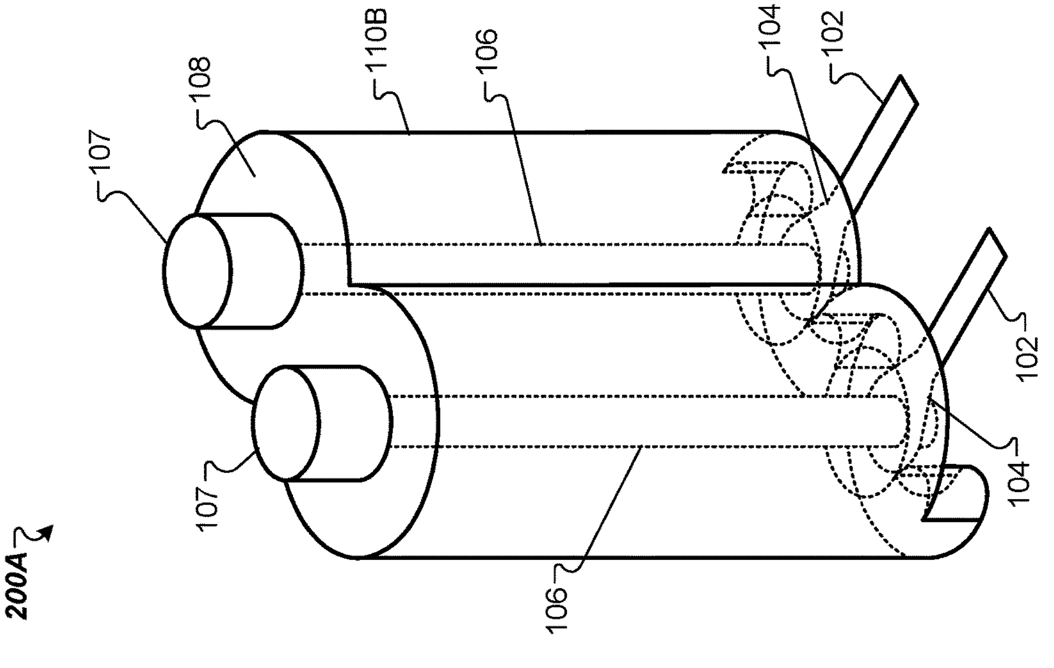

FIGS. 2A-2B are perspective views of an example dual coaxial ground shield, in accordance with at least some embodiments. Referring to FIG. 2A, a top perspective view 200A of an example coaxial ground shield 110B is shown. Referring to FIG. 2B, a bottom perspective view 200B of an example coaxial ground shield 110B is shown. The arrangements shown in FIGS. 2A-2B may be used for the transmission of a differential pair signal. In some embodiments, coaxial ground shield 110B substantially surrounds a first signal via 106 and a second signal via 106. A first signal trace 102 and a second signal trace 102 may electrically couple to the signal vias 106. In some embodiments, the coaxial ground shield 110B may include two substantially cylindrical and at least partially overlapping (e.g., conjoined) ground vias, each substantially coaxial with a corresponding signal via 106. In some embodiments, the coaxial ground shield 110B may have an ovular and/or an oblong shape. In some embodiments, such as when resin 108 is a low Dk resin, the two portions of coaxial ground shield 110B may not overlap (e.g., coaxial ground shield 110B may instead include two coaxial ground shields 110A in close proximity, etc.). A slot 111B may extend from the bottom of the coaxial ground shield 110B. The slot 111B may have two overlapping (e.g., conjoined) C-shaped profiles. The first signal via 106 may electrically couple to a first signal pad 104 within a first open area of slot 111B and the second signal via 106 may electrically couple to a second signal pad 104 within a second open area of slot 11B.

FIGS. 3A-3J are diagrams illustrating the fabrication of an example electronic device including a printed circuit board (PCB) having a coaxial ground shield, in accordance with at least some embodiments.

Figure 3A:
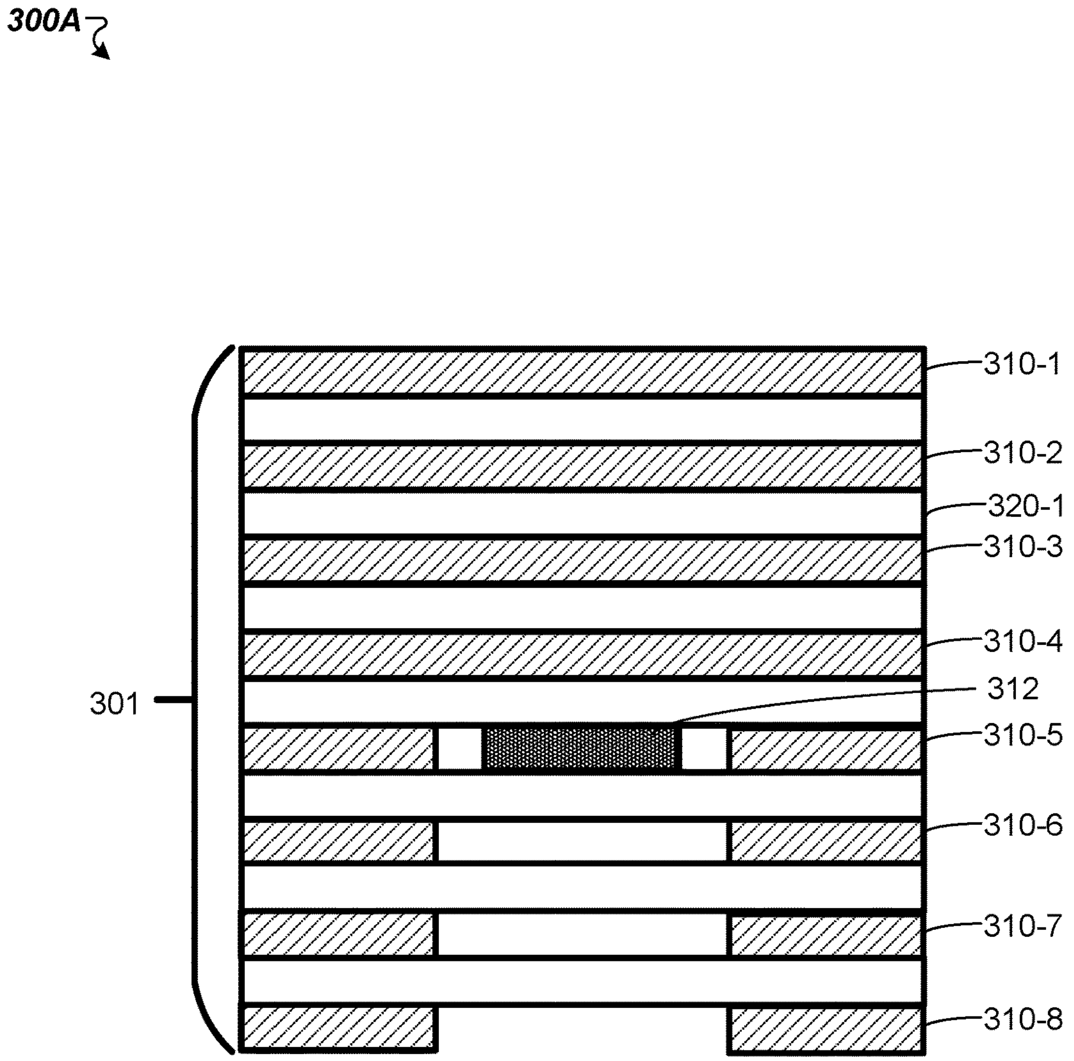
FIGS. 3A-3J are diagrams illustrating the fabrication of an example electronic device including a printed circuit board (PCB) having a coaxial ground shield, in accordance with at least some embodiments.

FIG. 3A shows operation 300A for obtaining a set of layers 301. The set of layers 301 can include alternating conductive layers and non-conductive layers. More specifically, each non-conductive layer may be disposed between a respective pair of conductive layers. For example, as shown, the set of layers 301 can include conductive layers 310-1 through 310-8 and non-conductive layers including non-conductive layer 320-1. In some embodiments, the set of layers 301 corresponds to a set of core layers of the PCB. Accordingly, in this illustrative example, the set of layers 301 includes 8 conductive layers. At least some of the conductive layers may include non-conductive material or may include insulating regions. For example, conductive layer 310-5 may include a non-conductive region surrounding a signal pad 312. In a similar example, conductive layers 310-6 through 310-8 may include non-conductive regions beneath the signal pad 312. In some embodiments, the signal pad 312 is electrically insulated from the remainder of conductive layer 310-5. The non-conductive regions may be formed by an absence of conductive material(s) in the non-conductive regions. For example, each of the conductive layers 310-1 through 310-8 may be formed with conductive material. The conductive material may be removed from the non-conductive regions (of layers 310-5 through 310-8) prior to lamination of the set of layers 301. Inclusion of the non-conductive regions of the conductive layers may be to insulate the signal pad 312 and/or metal plating of the coaxial ground shield (e.g., see FIGS. 3D-3F) from the remaining conductive portions of the conductive layers.

Each conductive layer 310-1 through 310-8 can include any suitable electrically conductive material (e.g., metal). Examples of materials that can be used to form each conductive layer 310-1 through 310-8 include copper (Cu), tungsten (W), cobalt (Co), molybdenum (Mo), ruthenium (Ru), etc. Non-conductive layers including non-conductive layer 320-1 may be formed from a non-conductive (e.g., electrically insulating) material. Examples of non-conductive materials that may be used for the non-conductive layers including non-conductive layer 320-1 include a composite plasticized phenol resin and paper material (e.g., FR-2), a composite material of woven fiberglass (e.g., FR-4), plastics, flexible plastics (e.g., for flexible circuit boards), and so on.

Figure 3B:
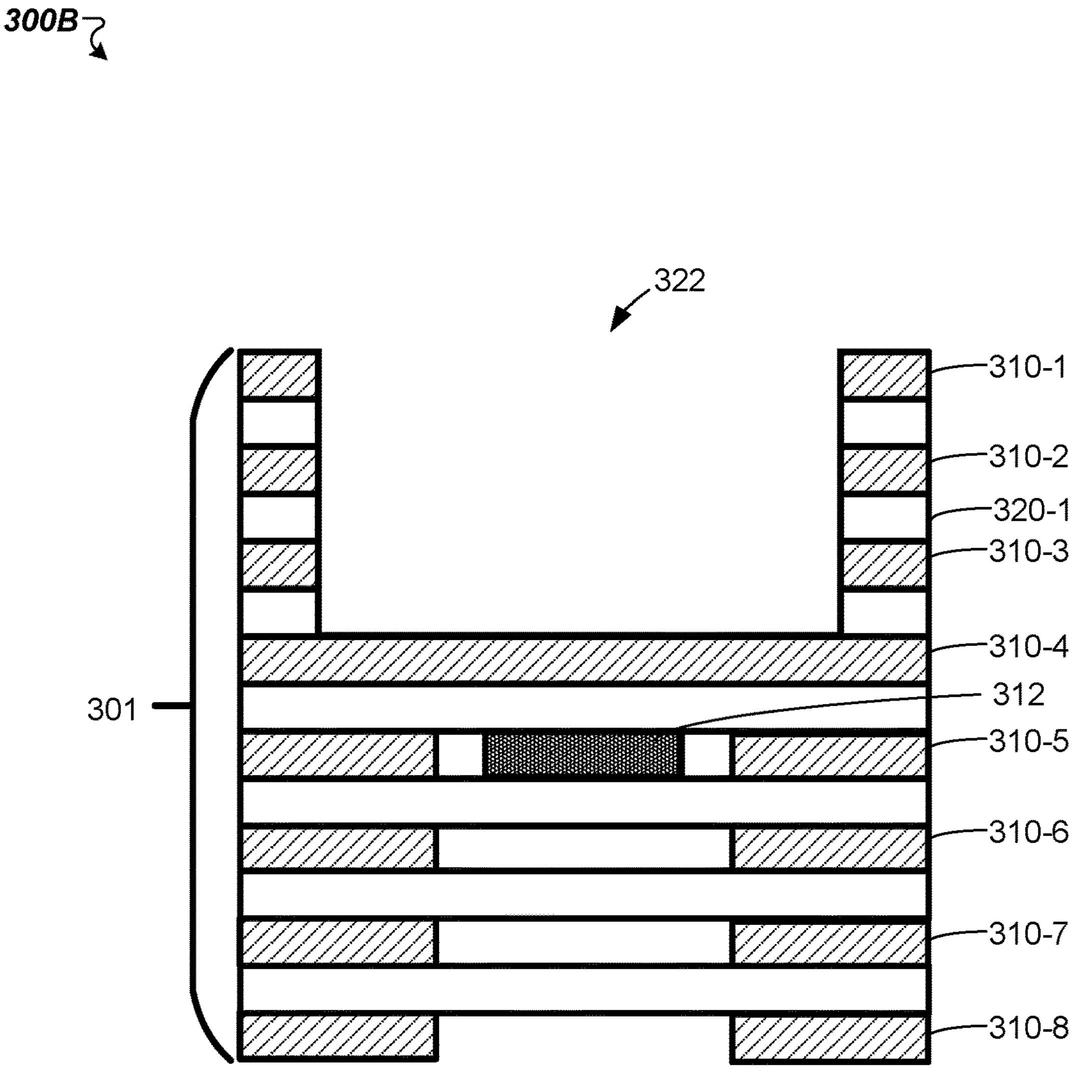

FIG. 3B shows operation 300B for drilling a ground hole 322 (e.g., for a coaxial ground shield). In some embodiments, a mechanical drilling tool (e.g., a drill bit, etc.) is used to drill hole 322. Hole 322 may be drilled through at least some of the set of layers 301. For example, the hole 322 may be drilled through conductive layers 310-1 through 310-3 and the non-conductive layer immediately beneath conductive layer 310-3. The bottom of the hole may be at or above the top of conductive layer 310-4. The hole 322 may be substantially cylindrical.

Figure 3C:
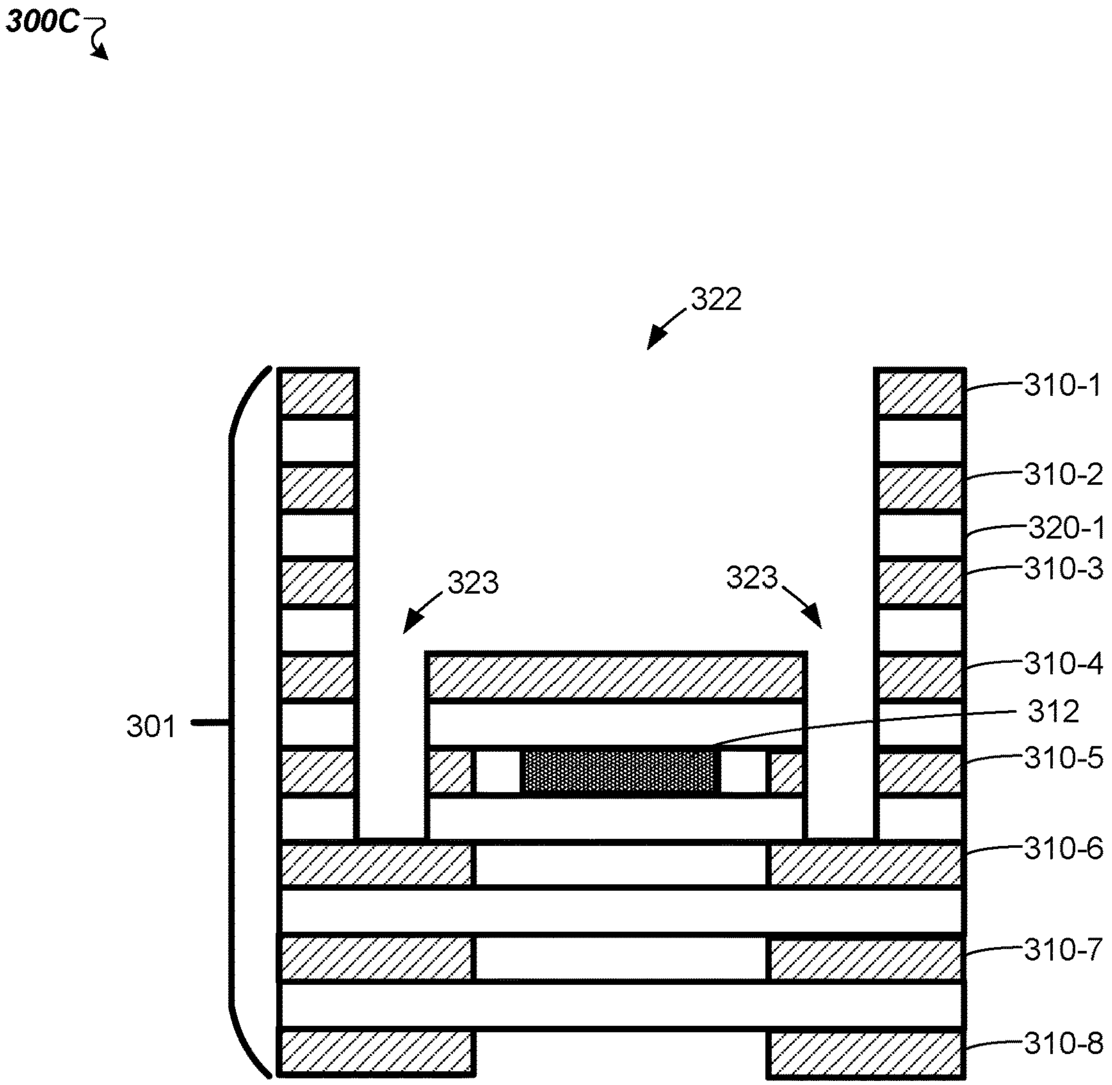

FIG. 3C shows operation 300C for forming a slot 323 in the bottom of the ground hole 322. In some embodiments, the slot 323 is formed by performing a laser drilling operation with a laser drilling tool (e.g., a laser driller, etc.). Multiple adjacent holes may be drilled (e.g., with the laser drilling tool) to form the slot 323. The slot 323 may be formed by drilling a first hole, a second hole immediately adjacent to the first hole, a third hole immediately adjacent to the second hole, etc. to make a C-shaped profile slot that at least partially surrounds the signal pad 312. In some embodiments, the slot 323 extends from a first depth (e.g., that corresponds with the depth of the ground hole 322) to a second depth below the signal pad 312. For example, the conductive pad 312 is disposed on an intermediate layer (e.g., layer 31-5) of the PCB. The slot may extend from the bottom of the ground hole 322 (e.g., layer 310-4) to another layer (e.g., layer 310-6) that is beneath the layer associated with the signal pad 312 (e.g., beneath layer 310-5).

Figure 3D:
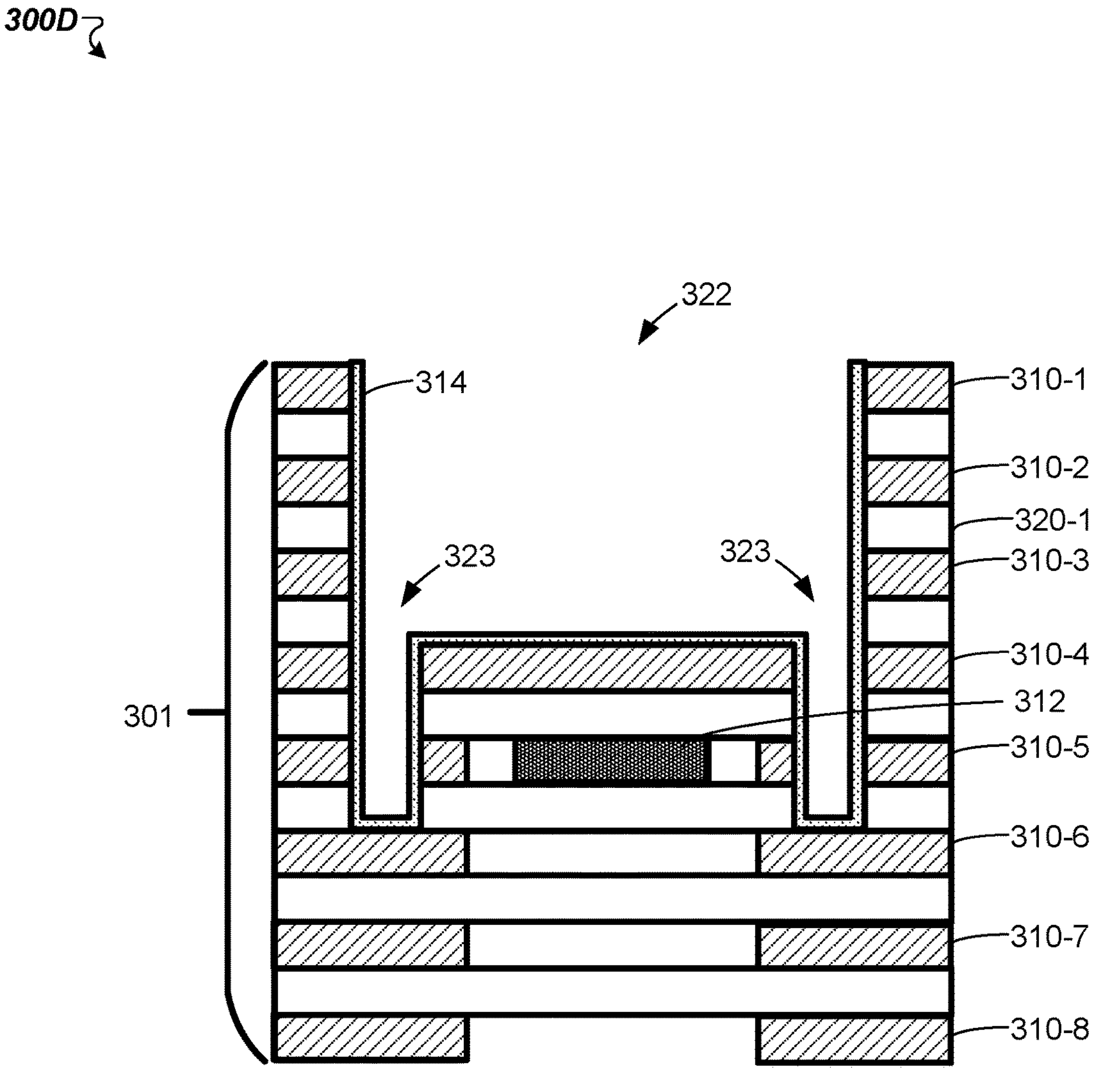

FIG. 3D shows operation 300D for plating the ground hole 322 and slot 323 with a metal plating 314. In some embodiments, the walls of the ground hole 322 and the slot 323 are plated with metal plating 314. The bottom of the ground hole 322 may additionally be plated with metal plating 314. The metal plating 314 on the walls of the ground hole 322 and the slot 323 may be electrically coupled to a ground layer of the PCB.

Figure 3E:
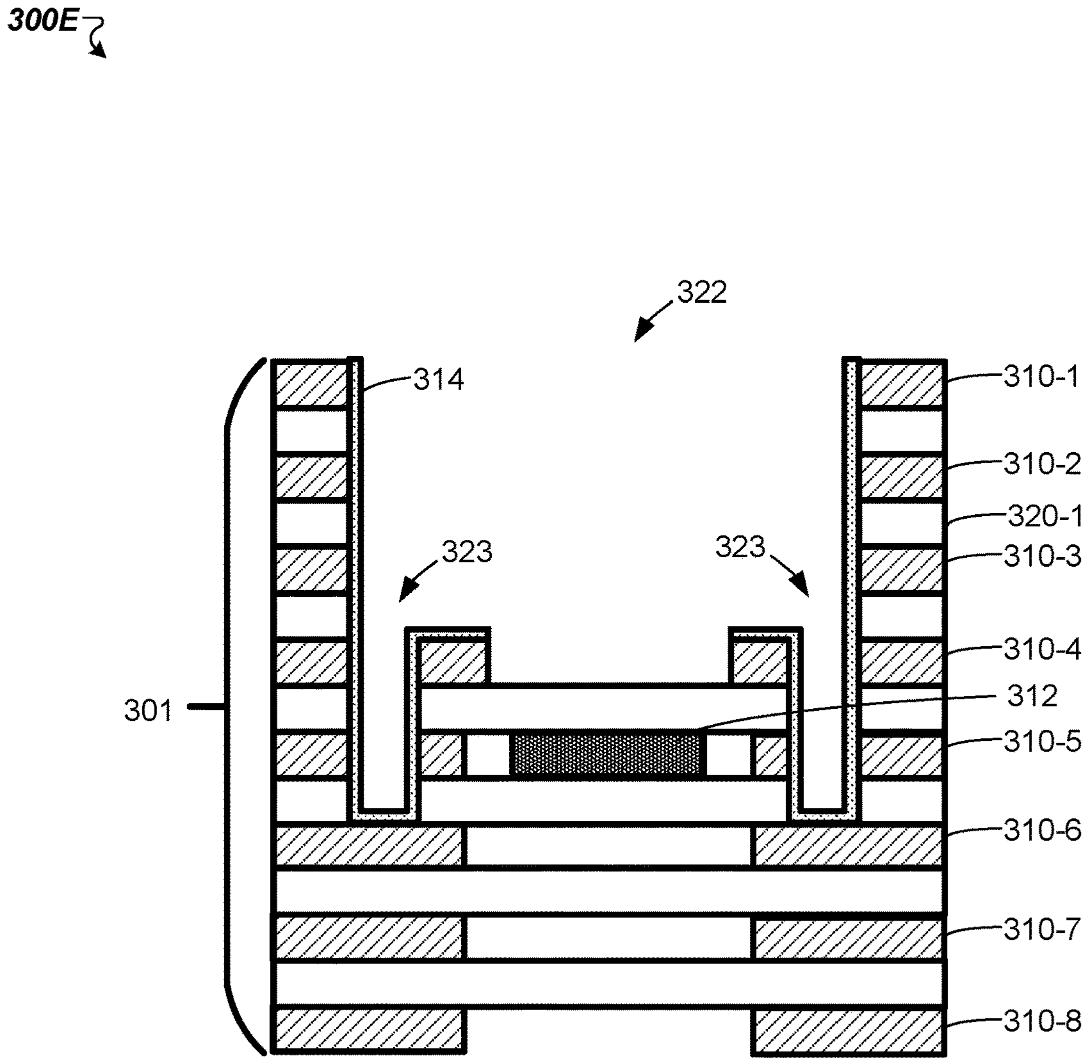

FIG. 3E shows operation 300E for drilling the bottom of hole 322. In some embodiments, the bottom of hole 322 is drilled (e.g., using a mechanical drilling tool such as a drill bit, etc.) to remove the metal plating from the bottom of hole 322. In some embodiments, the bottom of hole 322 is deepened to remove at least the metal plating 314 and a portion of conductive layer 310-4 so that a signal via can be drilled (e.g., see FIG. 3G).

Figure 3F:
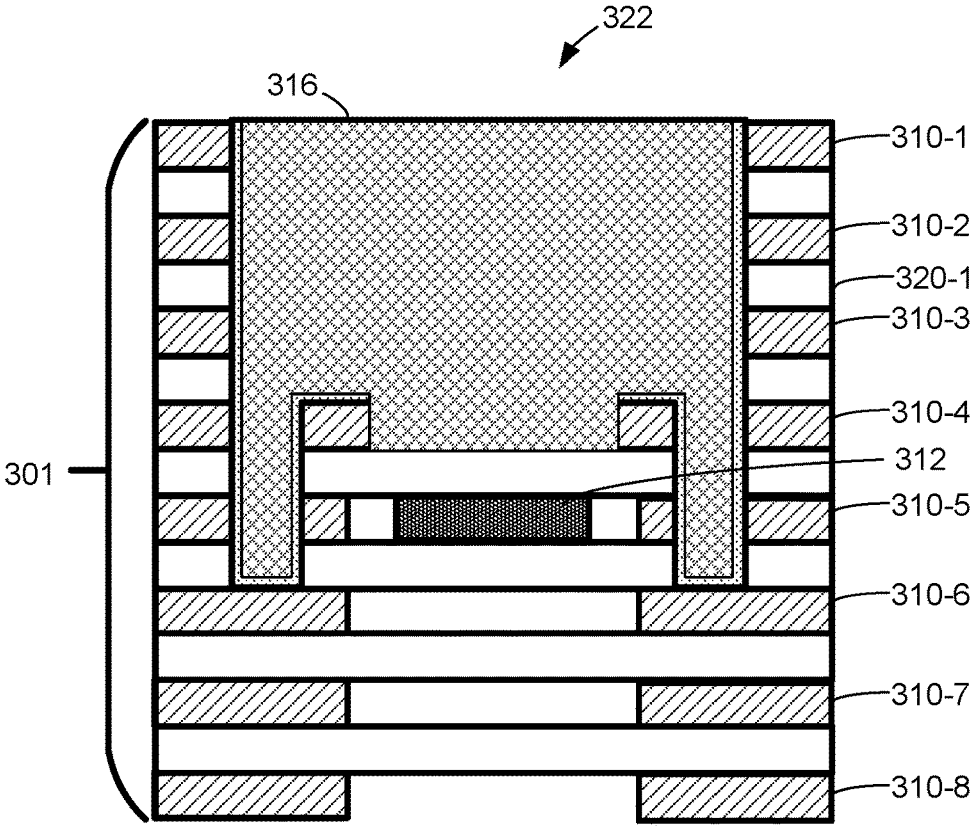

FIG. 3F shows operation 300F for filling the ground hole 322 (e.g., and the slot 323) with a resin 316. In some embodiments, the ground hole 322 is at least partially filled with resin 316 to minimize and/or eliminate voids within the PCB. The resin 316 may include an epoxy resin or a polyimide resin. The resin 316 may include an ink-based resin, etc.

Figure 3G:
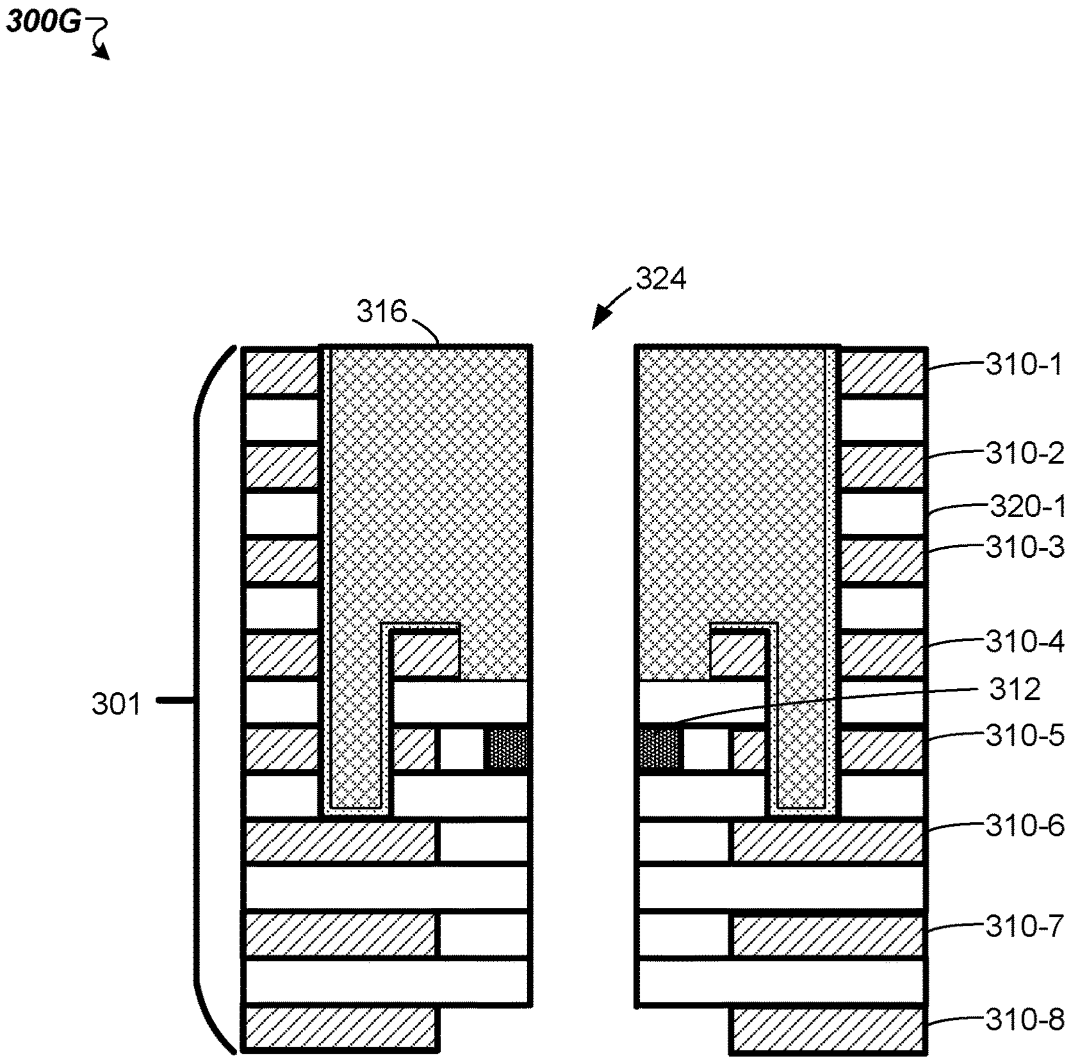

FIG. 3G shows operation 300G for drilling a through-hole 324 (e.g., for a through-hole signal via, etc.). In some embodiments, the through-hole 324 is drilled through the resin filling hole 322, one or more layers of the set of layers 301, and/or the signal pad 312. A mechanical drilling tool may be used to drill the through-hole 324. In some embodiments, the through-hole 324 is substantially coaxial with the ground hole 322.

Figure 3H:
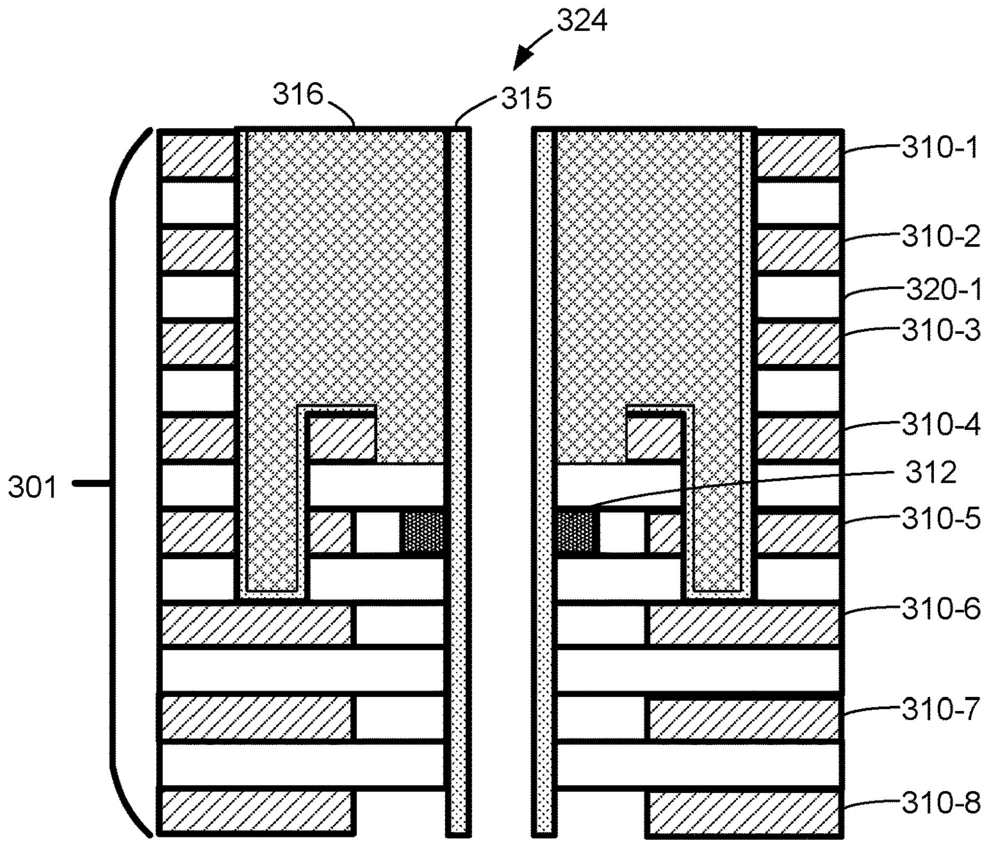

FIG. 3H shows operation 300H for plating the through-hole 324 with a metal plating 315. In some embodiments, the walls of the through-hole 324 are plated with a metal plating 315. The metal plating 315 may be substantially similar to and/or the same as metal plating 314. In some embodiments, the metal plating 315 on the walls of the through-hole 324 are electrically coupled to the signal pad 312. The metal plating 315 may be electrically insulated from the conductive layers 310-1 through 310-8 and/or the metal plating 314 by the resin 316, the non-conductive layers, and/or the non-conductive regions of the conductive layers.

Figure 3I:
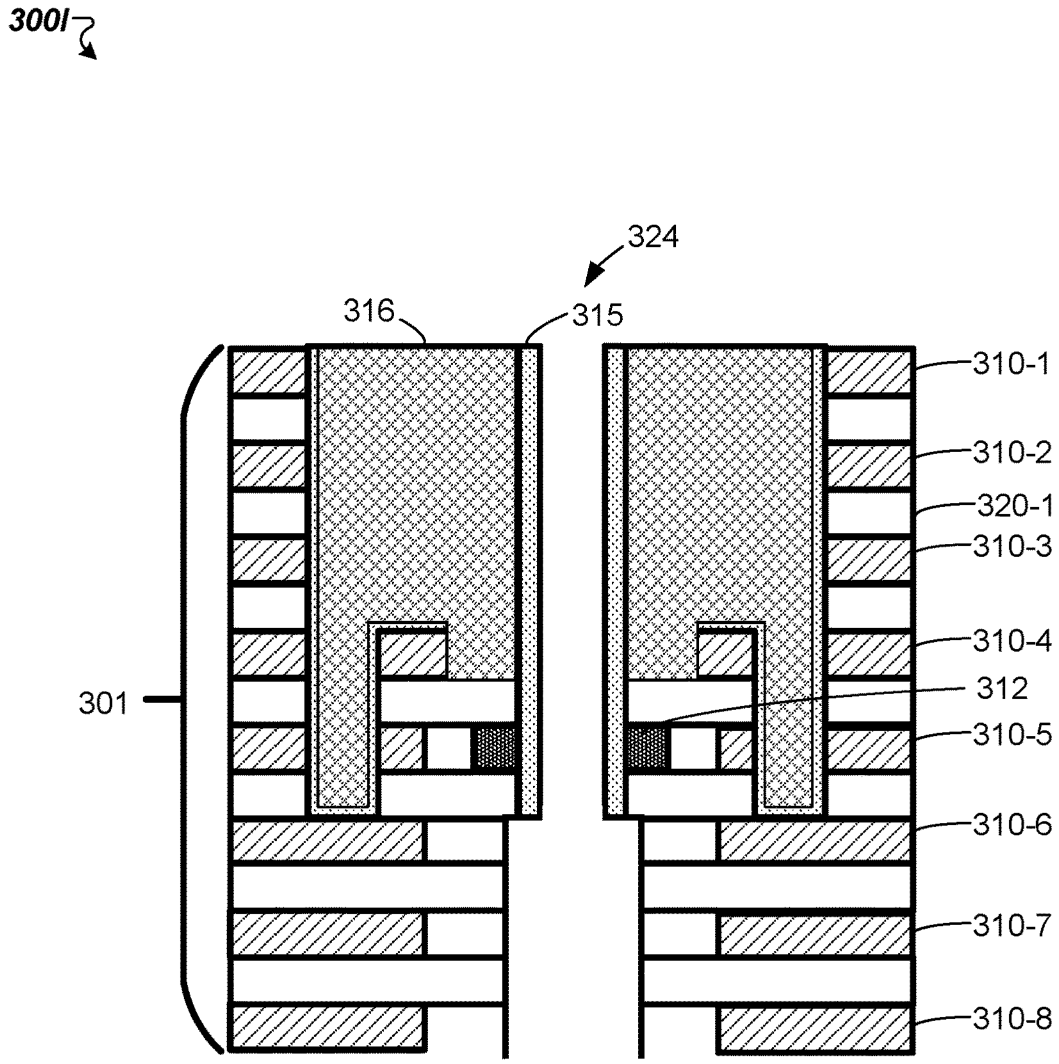

FIG. 3I shows operation 300I for back-drilling the through-hole 324. In some embodiments, the bottom portion of through-hole 324 is back-drilled (e.g., using a mechanical drilling tool) to remove the plating 315 from at least a portion of the through-hole 324 that is below the signal pad 312. Back-drilling may refer to increasing the diameter of the bottom portion of the through-hole 324 (e.g., to remove the plating 315). Removing at least some of the plating 315 from the lower portion of the through-hole 324 that is beneath the signal pad 312 may reduce the stub length of the signal via comprising the through-hole 324, which can improve the integrity of electrical signals transmitted through the signal via. In some embodiments, the through-hole 324 is back-drilled through at least one layer of the PCB. For example, through-hole 324 is back-drilled through conductive layer 310-8 and conductive layer 310-7. The upper portion of the through-hole 324 retains the metal plating 315. The upper portion of the through-hole 324 may correspond to the portion above an intermediate layer of the PCB (e.g., layer 310-5) having the signal pad 312. After back-drilling, the lower portion of the through-hole 324 lacks the metal plating 315.

Figure 3J:
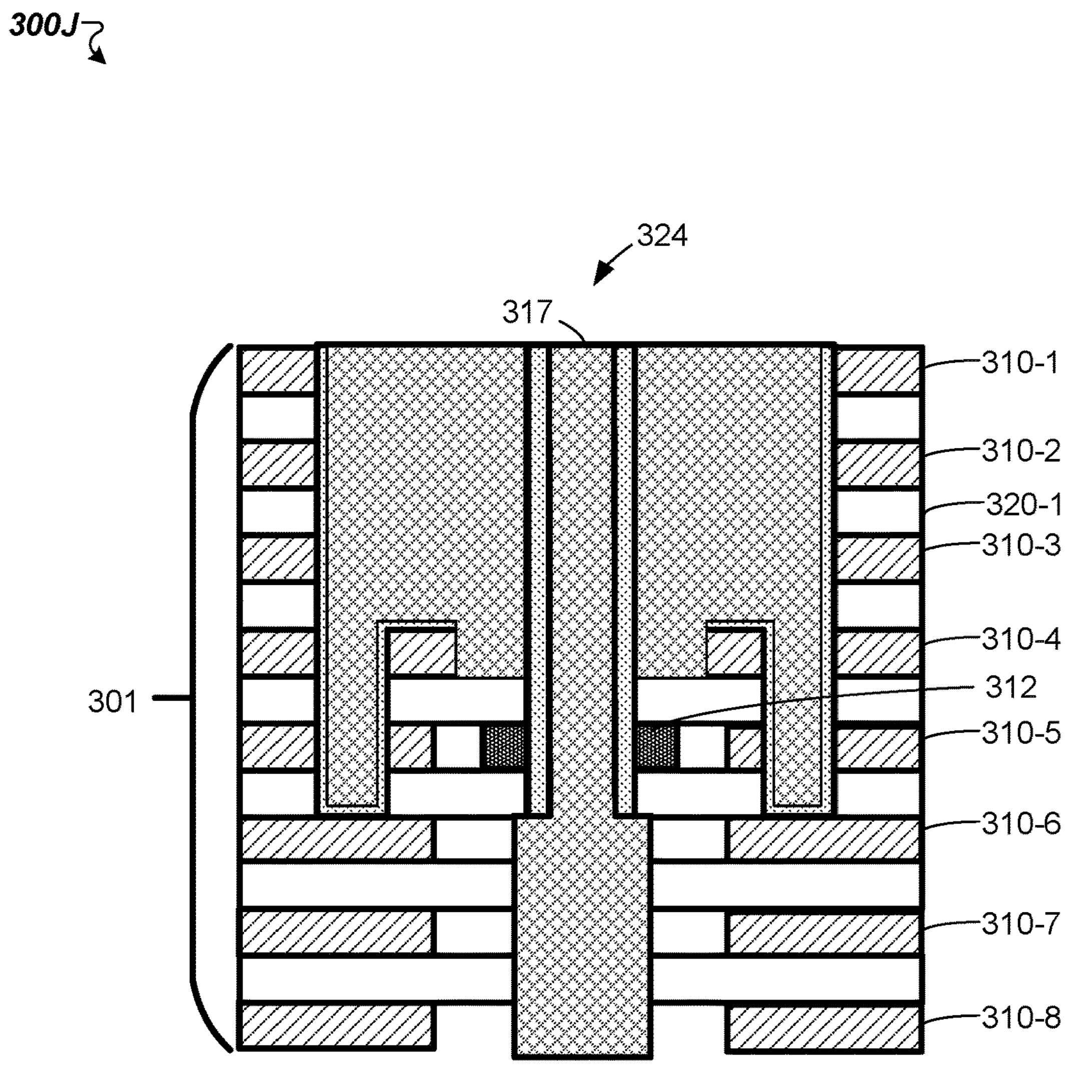

FIG. 3J shows operation 300J for filling the through-hole 324 with a resin 317. In some embodiments, the through-hole 324 is at least partially filled with resin 317 to minimize and/or eliminate voids within the PCB. The resin 317 may be substantially similar to and/or the same as resin 316. In some embodiments, a signal trace disposed on conductive layer 310-5 is electrically coupled to the metal plating 315 on the walls of through-hole 324 via signal pad 312. An electrical signal may be transmitted through the metal plating 315 to another signal pad and/or a via terminal disposed on another conductive layer. A coaxial ground shield (e.g., made up of ground hole 322 and associated metal plating, etc.) may reduce electrical interference such as crosstalk with respect to the electrical signal traveling between electrical components on the PCB.

Figure 4:
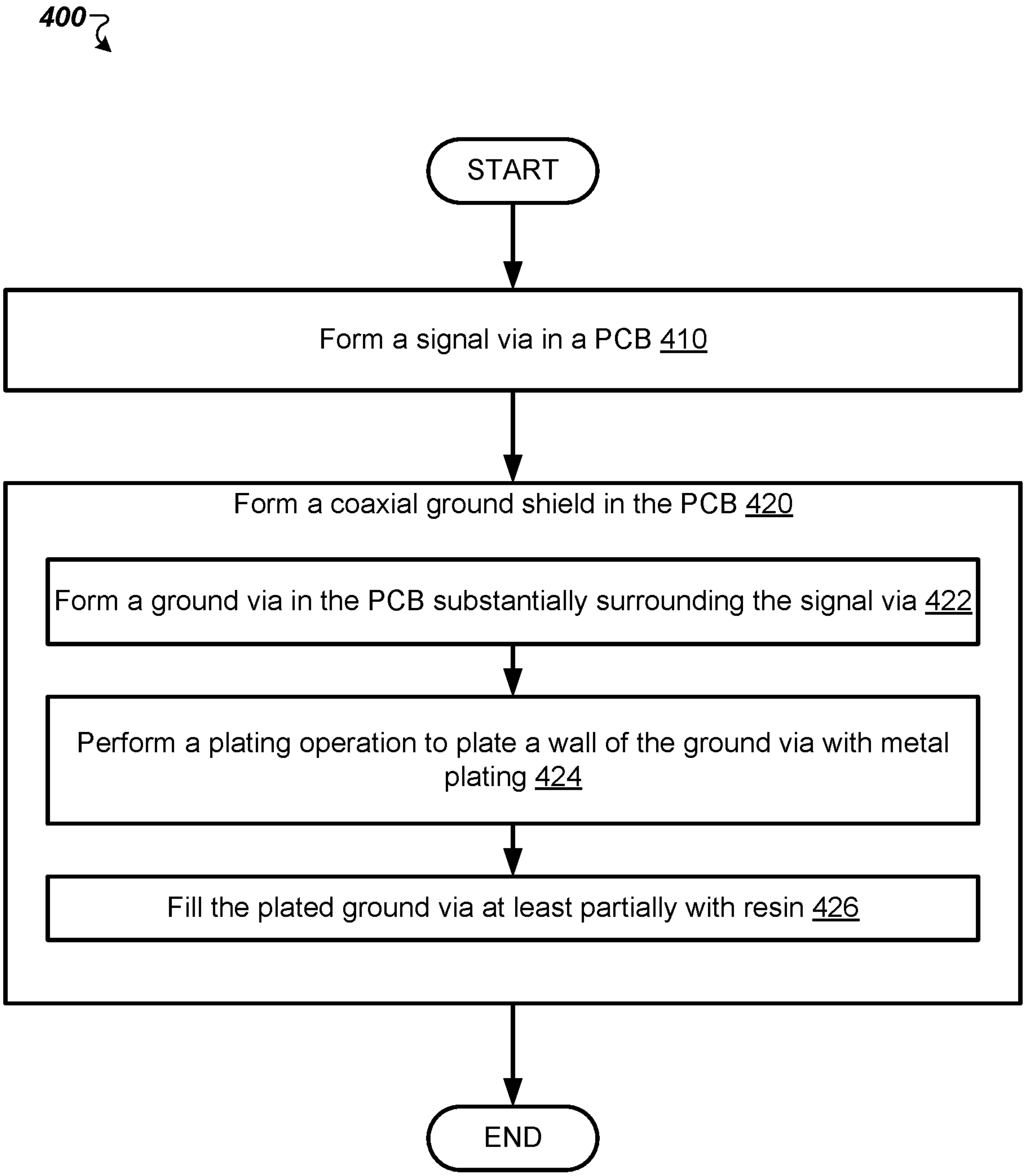
FIG. 4 is a flow diagram of an example method of fabricating an electronic device including a PCB having a coaxial ground shield, in accordance with at least some embodiments.

FIG. 4 is a flow diagram of an example method 400 of fabricating an electronic device including a PCB having a coaxial ground shield, in accordance with at least some embodiments. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, a signal via is formed in a PCB. The signal via may be a through-hole via as described herein above. The signal via may be formed by drilling through one or more layers of the PCB and/or a resin of a coaxial ground shield and plating the walls of the hole to electrically connect conductive signal pads and/or terminals on different layers of the PCB. In some embodiments, another signal via (e.g., a second signal via) is formed, such as in embodiments where the signal vias are to transmit a differential pair signal.

At operation 420, a coaxial ground shield is formed in the PCB. To form the coaxial ground shield, one or more sub-operations are performed. At operation 422, a ground via is formed in the PCB substantially surrounding the signal via. In some embodiments, the ground via is formed before the signal via. The ground via may be substantially coaxial with the signal via. At operation 424, a plating operation is performed with respect to the ground via to plate at least a wall of the ground via with metal plating. The metal plating may be a conductive metal plating (e.g., copper, tin, lead, gold, nickel, silver, or one or more metal alloys, etc.). At operation 426, the plated ground via is at least partially filled with resin. The resin may include an epoxy resin or a polyimide resin. Filling the ground via with resin may reduce voids in the PCB. In some embodiments, the signal via is formed (e.g., at operation 410) after the ground via is filled with resin.

Figure 5:
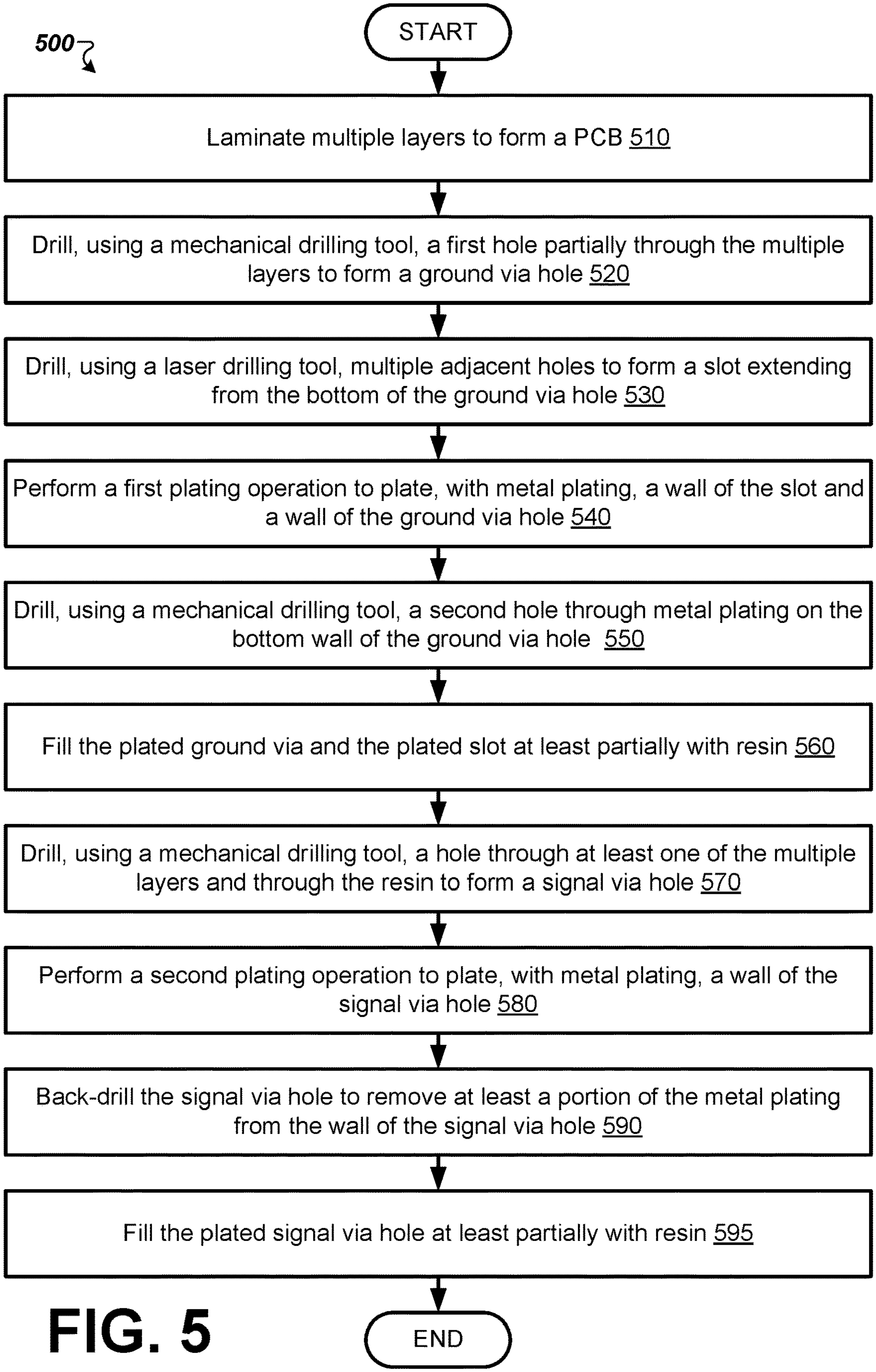
FIG. 5 is a flow diagram of an example method of fabricating an example electronic device including a PCB having a coaxial ground shield, in accordance with at least some embodiments.

FIG. 5 is a flow diagram of an example method 500 of fabricating an example electronic device including a PCB having a coaxial ground shield, in accordance with at least some embodiments. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, multiple layers are laminated to form a PCB. The multiple layers may include alternating conductive and non-conductive layers. The conductive layers may include traces to transmit electrical signals. The non-conductive layers may insulate the conductive layers from one another.

At operation 520, a hole is drilled partially through the multiple layers to form a ground via hole. The ground via hole may be a blind-hole that extends only partially through the PCB. The ground via hole may be drilled to a first depth in the PCB. In some embodiments, the hole is drilled using a mechanical drilling tool.

At operation 530, multiple adjacent holes are drilled to form a slot extending from the bottom of the ground via hole. The multiple adjacent holes may be drilled adjacent to one another. The multiple adjacent holes may be drilled to a second depth in the PCB deeper than the first depth (e.g., deeper than the depth of the ground via hole drilled at operation 520). In some embodiments, the slot has a C-shaped profile. In some embodiments, the multiple adjacent holes are drilled using a laser drilling tool.

At operation 540, a first plating operation is performed to plate, with metal plating, one or more walls of the slot and one or more walls of the ground via hole. In some embodiments, the wall of the slot and the wall of the ground via hole is plated with the same metal plating during the same plating operation. The metal plating can include a conductive metal plating as described herein above.

At operation 550, a second hole is drilled through the metal plating on the bottom wall of the ground via hole. The second hole may be drilled to remove the metal plating from the bottom wall of the ground via hole. In some embodiments, the second hole is drilled using a mechanical drilling tool.

At operation 560, the plated ground via and the plated slot are at least partially filled with resin. The resin may be an epoxy resin, a polyimide resin, and/or an ink resin as described herein above. Filling the plated ground via and the plated slot with resin may reduce the number of voids in the PCB.

At operation 570, a hole is drilled through at least one of the multiple layers of the PCB and through the resin at least partially filling the ground via to form a signal via hole. The signal via hole may be a through-hole that extends from a top layer to a bottom layer of the PCB. In some embodiments, the signal via hole is drilled using a mechanical drilling tool.

At operation 580, a second plating operation is performed to plate, with metal plating, a wall of the signal via hole. The metal plating can include a conductive metal plating as described herein above. In some embodiments, the signal via hole is plated with the same metal plating used to plate the ground via.

At operation 590, the signal via hole is back-drilled to remove at least a portion of the metal plating from the walls of the signal via hole. Back-drilling may include increasing the diameter of the signal via hole to remove some of the plating. In some embodiments, plating is removed from the signal via hole beneath a conductive pad to reduce the stub length of the signal via.

At operation 595, the plated signal via hole is at least partially filled with resin. The resin may be an epoxy resin, a polyimide resin, and/or an ink resin as described herein above. The resin used to fill the plated signal via hole may be the same resin used to fill the plated ground via hole. Filling the plated signal via hole with resin may reduce the number of voids in the PCB.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously, or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A device, comprising:

a printed circuit board (PCB) comprising a first signal trace electrically coupled to a first signal via; and a coaxial ground shield configured to reduce signal interference with respect to the first signal via, wherein the coaxial ground shield comprises:

a ground via formed in the PCB substantially surrounding the first signal via and substantially coaxial with the first signal via;

a slot extending from a bottom of the ground via at least partially surrounding a signal pad coupled to the first signal via;

metal plating on a wall of the ground via, wherein the metal plating is electrically coupled to a ground plane of the PCB; and resin at least partially filling the ground via.

2. The device of claim 1, wherein the PCB further comprises a second signal trace electrically coupled to a second signal via, and wherein the ground via substantially surrounds the first signal via and the second signal via.

3. The device of claim 1, wherein the first signal via is coupled to the first signal trace by the signal pad disposed on a first intermediate layer of the PCB, and wherein the ground via extends from a top layer of the PCB to a second intermediate layer of the PCB above the first intermediate layer.

4. The device of claim 3, wherein the slot extends from the second intermediate layer to a third intermediate layer of the PCB beneath the first intermediate layer.

5. The device of claim 1, wherein the slot substantially forms a C-shaped profile.

6. The device of claim 3, wherein the first signal via extends from the top layer of the PCB to a bottom layer of the PCB, and wherein at least an upper portion of the first signal via between the top layer and the first intermediate layer comprises the metal plating.

7. The device of claim 6, wherein a lower portion of the first signal via between the first intermediate layer and the bottom layer lacks the metal plating.

8. The device of claim 1, further comprising one or more electrical components electrically coupled to the PCB.

9. A method, comprising:

forming a first signal via in a printed circuit board (PCB) having multiple layers; and forming a coaxial ground shield in the PCB, wherein forming the coaxial ground shield comprises:

forming a ground via in the PCB substantially surrounding the first signal via and substantially coaxial with the first signal via;

forming a slot in the PCB extending from a bottom of the ground via;

performing a first plating operation to plate a wall of the ground via with metal plating; and filling the ground via at least partially with resin.

10. The method of claim 9, further comprising:

forming a second signal via in the PCB, wherein the ground via substantially surrounds the first signal via and the second signal via.

11. The method of claim 9, wherein forming the coaxial ground shield in the PCB comprises:

drilling, using a mechanical drilling tool, a hole to a first depth to form the ground via; and drilling, using a laser drilling tool, multiple adjacent holes to a second depth deeper than the first depth to form the slot in the PCB extending from the bottom of the ground via.

12. The method of claim 11, wherein the slot substantially forms a C-shaped profile.

13. The method of claim 9, wherein forming the first signal via in the PCB comprises:

drilling, using a mechanical drilling tool, a hole through at least one of the multiple layers of the PCB and through the resin filling the ground via;

performing a second plating operation to further plate a wall of the hole with metal plating; and filling the hole at least partially with resin.

14. The method of claim 13, wherein forming the first signal via in the PCB further comprises:

back-drilling the hole to remove at least a portion of the metal plating from the wall of the hole prior to filling the hole at least partially with resin, wherein the metal plating is removed from a portion of the wall beneath a signal pad disposed on an intermediate layer of the PCB.

15. The method of claim 9, further comprising:

laminating the multiple layers to form the PCB, wherein the first signal via extends from a top layer of the PCB to a bottom layer of the PCB.

16. A printed circuit board (PCB), comprising:

a first signal trace;

a first signal via electrically coupled to the first signal trace; and a coaxial ground shield configured to reduce signal interference with respect to the first signal via, wherein the coaxial ground shield comprises:

a ground via formed in the PCB substantially surrounding the first signal via and substantially coaxial with the first signal via;

a slot extending from a bottom of the ground via at least partially surrounding a signal pad;

metal plating on a wall of the ground via, wherein the metal plating is electrically coupled to a ground plane of the PCB; and resin at least partially filling the ground via.

17. The PCB of claim 16, further comprising:

a second signal trace; and a second signal via electrically coupled to the second signal trace, wherein the ground via substantially surrounds the first signal via and the second signal via.

18. The PCB of claim 16, further comprising:

the signal pad disposed on a first intermediate layer of the PCB, wherein the ground via extends from a top layer of the PCB to a second intermediate layer of the PCB above the first intermediate layer.

19. The PCB of claim 18, wherein the slot extends from the second intermediate layer to a third intermediate layer of the PCB beneath the first intermediate layer.

20. The PCB of claim 18, wherein the first signal via extends from the top layer of the PCB to a bottom layer of the PCB, and wherein at least an upper portion of the first signal via between the top layer and the first intermediate layer comprises the metal plating.

21. A device, comprising:

a printed circuit board (PCB) comprising a first signal trace electrically coupled to a first signal via; and a coaxial ground shield configured to reduce signal interference with respect to the first signal via, wherein the first signal via is coupled to the first signal trace by a signal pad disposed on a first intermediate layer of the PCB, wherein the coaxial ground shield comprises:

a ground via formed in the PCB substantially surrounding the first signal via and substantially coaxial with the first signal via, wherein the ground via extends from a top layer of the PCB to a second intermediate layer of the PCB above the first intermediate layer;

metal plating on a wall of the ground via, wherein the metal plating is electrically coupled to a ground plane of the PCB; and resin at least partially filling the ground via.

22. A method, comprising:

forming a first signal via in a printed circuit board (PCB) having multiple layers; and forming a coaxial ground shield in the PCB, wherein forming the coaxial ground shield comprises:

forming a ground via in the PCB substantially surrounding the first signal via and substantially coaxial with the first signal via;

performing a first plating operation to plate a wall of the ground via with metal plating; and filling the ground via at least partially with resin, wherein forming the first signal via in the PCB comprises:

drilling, using a mechanical drilling tool, a hole through at least one of the multiple layers of the PCB and through the resin filling the ground via;

performing a second plating operation to further plate a wall of the hole with metal plating; and filling the hole at least partially with resin.

* * * * *